United States Patent [19]

Bergeron et al.

[11] 4,157,268

[45] Jun. 5, 1979

[54] LOCALIZED OXIDATION ENHANCEMENT FOR AN INTEGRATED INJECTION LOGIC CIRCUIT

[75] Inventors: David L. Bergeron, Manassas; Geoffrey B. Stephens, Catlett, both of Va.

[73] Assignee: International Business Machines Corporation, Armonk, N.Y.

[21] Appl. No.: 807,286

[22] Filed: Jun. 16, 1977

[51] Int. Cl.$^2$ ............................................. H01L 21/26
[52] U.S. Cl. ..................... 148/1.5; 148/175; 148/187; 357/48; 357/91
[58] Field of Search ................. 148/1.5, 175, 187; 357/48, 91

[56] References Cited

U.S. PATENT DOCUMENTS

| | | | |
|---|---|---|---|
| 3,655,457 | 4/1972 | Duffy et al. | 148/1.5 |
| 3,677,837 | 7/1972 | Ashar | 148/175 |
| 3,718,502 | 2/1973 | Gibbons | 148/1.5 X |
| 3,730,778 | 5/1973 | Shannon et al. | 148/1.5 |
| 3,756,862 | 9/1973 | Ahn et al. | 148/1.5 |
| 3,761,319 | 9/1973 | Shannon | 148/1.5 |
| 3,810,123 | 5/1974 | Baitinger et al. | 340/173 FF |
| 3,821,781 | 6/1974 | Chang et al. | 357/44 |
| 3,884,732 | 5/1975 | Baitinger et al. | 148/175 |
| 3,954,856 | 3/1976 | Koenig et al. | 148/1.5 |
| 4,001,049 | 1/1977 | Baglin et al. | 148/1.5 |
| 4,016,007 | 4/1977 | Wada et al. | 148/1.5 |
| 4,043,849 | 8/1977 | Kraft et al. | 148/187 |

OTHER PUBLICATIONS

Berger et al., IBM Technical Disclosure Bulletin, vol. 16, No. 2, Jul. 1973, pp. 650 and 651.
Rideout, IBM Technical Disclosure Bulletin, vol. 18, No. 5, Oct. 1975, p. 1616.
Mueller et al., IBM Technical Disclosure Bulletin, vol. 19, No. 3, Aug. 1976, pp. 865 and 866.

*Primary Examiner*—G. Ozaki
*Attorney, Agent, or Firm*—John E. Hoel

[57] ABSTRACT

A device and method are disclosed for incorporating on a single semiconductor chip, integrated injection logic (I$^2$L) circuits operating at low signal voltages and off chip driver devices operating at relatively high signal voltages. The vertical NPN transistor operated in an upward injection mode as is conventionally employed in I$^2$L circuitry, is formed with a thinner epitaxial layer between the buried subemitter and the base region than is the thicker epitaxial layer separating the buried subcollector from the base region in the downward injecting NPN vertical transistors employed as the off chip drivers and receivers on the same semiconductor chip. A method is disclosed for forming this structure which employs the technique of introducing damage in the epitaxial region above the buried subemitter of the I$^2$L vertical transistor so as to enhance the reactivity of the epitaxial surface to a subsequent oxidation reaction step. By increasing the rate of oxidation in the epitaxial layer, a locally thinned region can be formed, into which the base and collector structures can be subsequently formed.

9 Claims, 18 Drawing Figures

FIG. 1A "UPWARD INJECTING"

FIG. 2A "DOWNWARD INJECTING"

"UPWARD INJECTING"

"DOWNWARD INJECTING"

4,157,268

LOCALIZED OXIDATION ENHANCEMENT FOR AN INTEGRATED INJECTION LOGIC CIRCUIT

FIELD OF THE INVENTION

The invention broadly relates to semiconductor processing and more particularly relates to specialized processes for making bipolar transistors having different voltage characteristics on the same semiconductor chip.

BACKGROUND OF THE INVENTION

Integrated injection logic ($I^2L$) circuits operate at a relatively low signal level of one volt. Significant problems have confronted the prior art in attempting to achieve signal communication between separate $I^2L$ chips because of this low signal level. Auxiliary voltage boosting circuits at the chip I/O require a higher voltage breakdown characteristic in the base-collector junction of the vertical bipolar device used in the off chip driver (OCD). But increasing the base-collector thickness in the downward injecting, vertical bipolar OCD causes the upward injecting vertical bipolar transistor used in the internal $I^2L$ logic circuits to have a poor emitter efficiency and a large charge storage characteristic, since both devices must be made simultaneously in any practical, economic fabrication process. Thus existing practical $I^2L$ circuits face the dilemma of either having fast internal logic circuitry and low voltage OCDs or slower internal logic circuitry and higher voltage OCD's.

OBJECTS OF THE INVENTION

It is therefore an object of the invention to form a bipolar circuit in an improved manner.

It is another object of the invention to form an $I^2L$ circuit which has both fast internal logic circuits and high signal voltage off chip drivers on the same semiconductor chip.

SUMMARY OF THE INVENTION

These and other objects, features and advantages are accomplished by the device and process disclosed herein.

A device and method are disclosed for incorporating on a single semiconductor chip, $I^2L$ circuits operating at low signal voltages and off chip driver devices operating at relatively high signal voltages. The vertical NPN transistor operated in an upward injection mode as is conventionally employed in $I^2L$ circuitry, is formed with a thinner epitaxial layer between the buried subemitter and the base region than is the thicker epitaxial layer separating the buried subcollector from the base region in the downward injecting NPN vertical transistors employed as the off chip drivers and receivers on the same semiconductor chip. By reducing the epitaxial layer thickness for the upward injecting vertical transistors in the $I^2L$ circuits, the charge storage characteristic of the device is reduced and the injection efficiency of the device is increased. By increasing the epitaxial thickness in the downward injecting vertical transistors used for the off chip drivers and receivers, a larger signal voltage can be employed since the base to subcollector junction has a higher breakdown voltage characteristic. A method is disclosed for forming this structure which employs the technique of introducing damage in the epitaxial region above the buried subemitter of the $I^2L$ vertical transistor so as to enhence the reactivity of the epitaxial surface to a subsequent oxidation reaction step. By increasing the rate of oxidation in the epitaxial layer, a locally thinned region can be formed, into which the base and collector structures can be subsequently formed using the same steps as are employed to form the base and emitter structures in the downward injection NPN used as the off chip driver device.

DESCRIPTION OF THE FIGURES

FIGS. 1a through 1i show the sequence of stages in the formation of the upward injecting bipolar transistor in an $I^2L$ circuit, in accordance with the invention.

FIGS. 2a through 2i show the simultaneous sequence of corresponding stages in the formation of the downward injecting bipolar transistor which serves as the off-chip driver for the $I^2L$ circuits on the same semiconductor chip, in accordance with the invention.

DISCUSSION OF THE PREFERRED EMBODIMENT

Figure 1B:
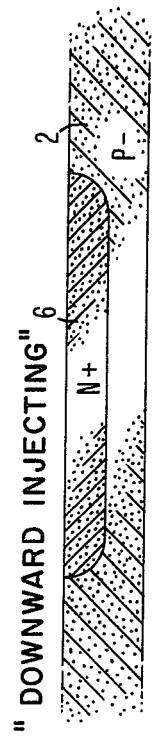
Figure 1B:
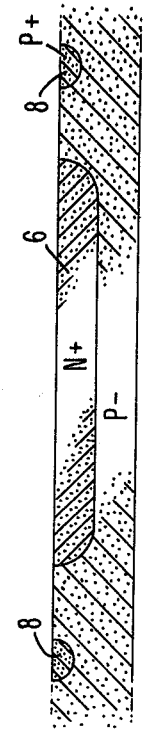

A device and method are disclosed for incorporating on a single semiconductor chip, integrated injection logic ($I^2L$) circuits operating at low signal voltages and off chip driver devices operating at relatively high signal voltages. The vertical NPN transistor operated in an upward injection mode as is conventionally employed in $I^2L$ circuitry, is formed with a thinner epitaxial layer between the buried subemitter and the base region than is the thicker epitaxial layer separating the buried subcollector from the base region in the downward injecting NPN vertical transistors employed as the off chip drivers and receivers on the same semiconductor chip. By reducing the epitaxial layer thickness for the upward injecting vertical transistors in the $I^2L$ circuits, the charge storage characteristic of the device is reduced and the injection efficiency of the device is increased. By increasing the epitaxial thickness in the downward injecting vertical transistors used for the off chip drivers and receivers, a larger signal voltage can be employed since the base to subcollector junction has a higher breakdown voltage characteristic. A method is disclosed for forming this structure which employs the technique of introducing damage in the epitaxial region above the buried subemitter of the $I^2L$ vertical transistor so as to enhance the reactivity of the epitaxial surface to a subsequent oxidation reaction step. By increasing the rate of oxidation in the epitaxial layer, a locally thinned region can be formed, into which the base and collector structures can be subsequently formed using the same steps as are employed to form the base and emitter structures in the downward injection NPN used as the off chip driver device Referring now to the Figures, FIGS. 1a through 1i and FIGS. 2a through 2i show the same stages of formation for the upward injecting and downward injecting vertical transistors, respectively, with like alphabetical letters referring to simultaneous processing stages.

FIGS. 1a and 2a show the formation of the N+ subemitter 4 and the N+ subcollector 6, respectively in the P-type substrate 2, for the upward injecting and the downward injecting transistors, respectively. The N+ subregions 4 and 6 are formed by a conventional arsenic capsule diffusion through windows formed by conventional photolithography through a thermal $SiO_2$ masking layer grown on the P-type substrate 2. The substrate 2 has a resistivity of 5–20Ω-cm. The N+ regions 4 and 6 have a surface concentration greater than $10^{20}$cm$^{-3}$ and a junction depth of 2.5 um. The regions 4 and 6 are reoxidized before forming the buried P+ regions 8. It should be apparent that all N-type conductivities and P-type conductivities can be reversed to their respective opposite types without changing the operating principles of the invention.

Figure 2B:
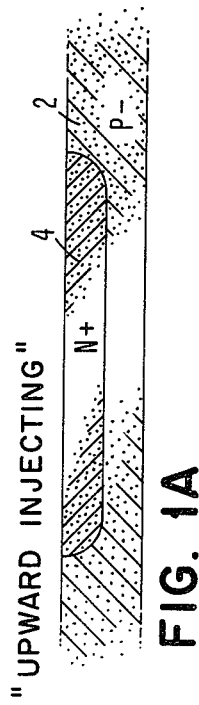
Figure 2B:
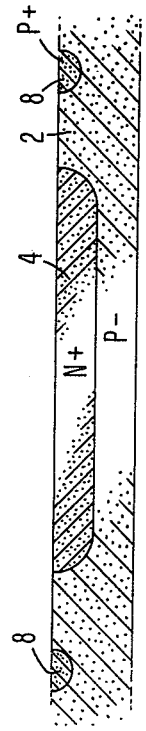

FIGS. 1b and 2b show the formation of the P+ buried isolation regions 8 in the upward injecting and downward injecting transistors, respectively. The P+ buried regions 8 are formed by a conventional boron capsule diffusion into windows formed by conventional photolithography in the cumulative thermal SiO$_2$ masking layer. The P+ regions 8 have a surface concentration greater than $10^{20}$cm$^{-3}$ and a junction depth of 3.0 um.

Figure 1C:
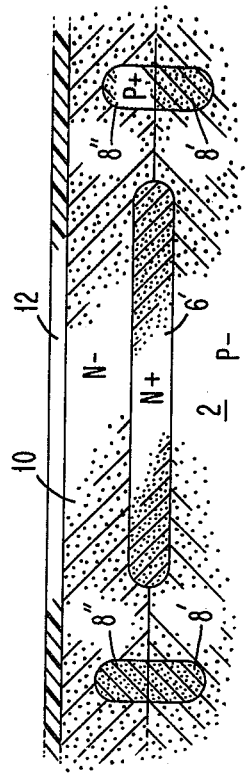
Figure 2C:
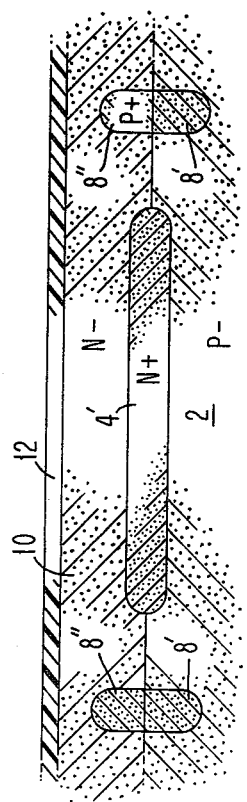

FIGS. 1c and 2c show the formation of the epitaxial layer 10 for the upward injecting and downward injecting transistors, respectively. After stripping the previous oxide masking layer, an N$^-$ layer 10 is epitaxially grown to a thickness of 3.2 um with a doping concentration of $2 \times 10^{16}$cm$^{-3}$. The buried isolation diffusions 8 are seen to outdiffuse as the portion 8' in the substrate 2 in the portion 8" in the epitaxial layer 10.

A layer of silicon dioxide 12 is formed on the epitaxial layer 10. The oxide layer 12 is thermally grown in a dry oxygen and steam ambient at 970° C. to a thickness of 300 nm.

Figure 1D:
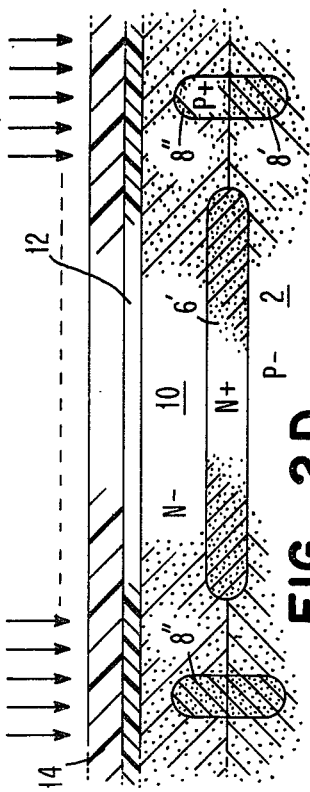
Figure 2D:
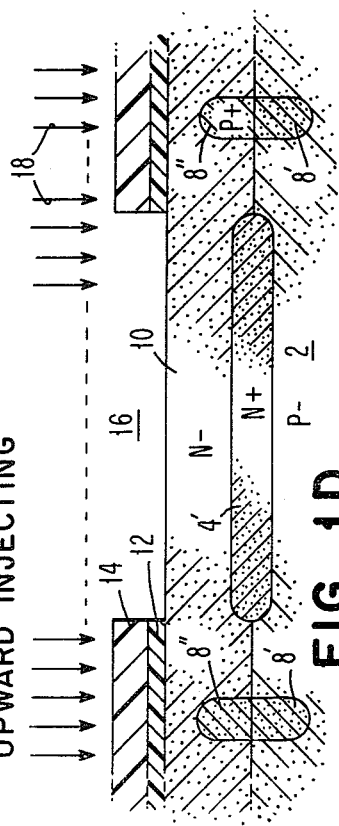

FIGS. 1d and 2d show the formation of the photo-resist layer 14 over the silicon dioxide layer 12 which will serve as the ion implantation mask barrier. In the upward injecting vertical transistor shown in FIG. 1d, a window 16 is opened through the photo-resist layer 14 and the silicon dioxide layer 12 to expose the surface of the epitaxial layer 10. No corresponding window is opened over the downward injecting vertical transistor as shown in FIG. 2d. The photoresist and oxide windows are formed by conventional photolithographic and etch techniques.

There follows a step of implanting ions 18 of any atomic species that can induce crystalline damage in the exposed region of the epitaxial layer 10 beneath the window 16. Suitable atoms include H, He, Ne, Ar, Kr, O, Si, C, B and Al. The purpose of including crystalline damage in the exposed region of the epitaxial layer 10 is to enhance the reactive oxidation rate of the surface and percentage of Si consumed during a subsequent oxidation step. The implantation is performed with a conventional ion implantation machine whose acceleration voltage ranges between of 10–500 Kev at doses ranging from $10^{12}$ to $10^{16}$ ions per square centimeter.

The photo-resist layer 14 and the oxide layer 12 are selected to be thick enough to mask out the penetration of the ion beam 18 in those areas of the epitaxial layer 10 which are not exposed through the window 16. A table of the example thicknesses of photo-resist, silicon dioxide, ionic species implanted dose and acceleration voltage are shown in the Table which follows.

Table

| Photo-resist Layer (14) Thickness | Oxide Layer (12) Thickness Before/ After Layer (20) Formed | Ionic Species | Ionic Dose | Acceleration Voltage | Oxide Layer (20) Thickness |
|---|---|---|---|---|---|
| 2 um | 300/320 nm | 0 | $10^{14}$ | 50 Kev | 200 nm |
| 2 um | 300/390 nm | 0 | $10^{14}$ | 150 Kev | 500 nm |
| 2 um | 300/320 nm | Ar | $10^{14}$ | 140 Kev | 200 nm |
| 2 um | 300/390 nm | Ar | $10^{14}$ | 300 Kev | 500 nm |

Table-continued

| Photo-resist Layer (14) Thickness | Oxide Layer (12) Thickness Before/ After Layer (20) Formed | Ionic Species | Ionic Dose | Acceleration Voltage | Oxide Layer (20) Thickness |
|---|---|---|---|---|---|
| 2 um | 300/320 nm | Si | $10^{14}$ | 70 Kev | 200 nm |
| 2 um | 300/390 nm | Si | $10^{14}$ | 200 Kev | 500 nm |

Figure 1E:
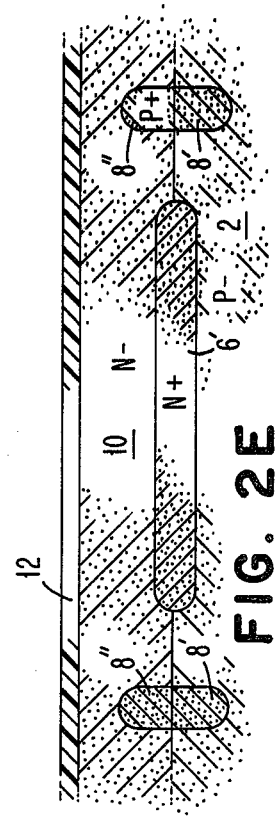
Figure 2E:
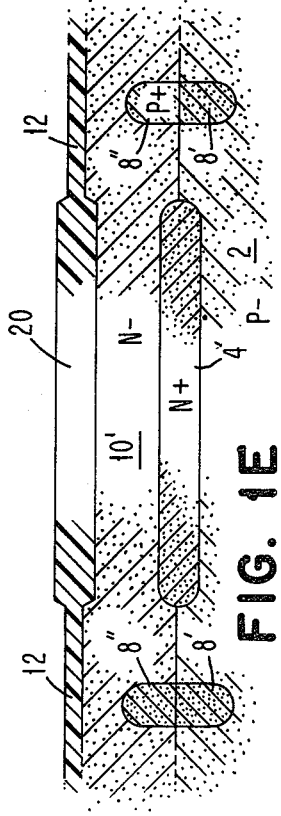

FIGS. 1e and 2e show the formation of the silicon dioxide layer 20 after the removal of the photo-resist mask 14. It is seen that the depth of penetration of silicon dioxide layer 20 is greater than any increase in the thickness of the existing silicon dioxide layer 12 since the crystalline damage induced in the epitaxial layer 10 due to the ion implanted species 18, has enhanced the reactivity of the epitaxial layer 10 so exposed in the oxidation reaction. The thermal oxidation reaction is performed at 970° C. in a mixture of dry oxygen and steam ambient with a cycle time adjusted to totally consume the damaged region in silicon layer 10 beneath window 16. The Table gives thicknesses of the thermally grown silicon dioxide region 20 for steam cycles which have been determined to result in an increased oxidation rate of three times that for the undamaged portion of the silicon layer 10. Significant radiation damage is found to lie within 2 times the standard deviation from the peak of the distribution of the implanted ionic species. The temperature of the oxidation step in FIGS. 1E and 2E may vary from 800° C. to 1200° C. and proceed for a period of time 0.5 minutes to 10 hours, in order to achieve the desired thickness for layer 20. It has been found that the oxidation of the silicon at 800° C. proceeds faster than the rediffusion of the ion-implanted ionic species 18, such as boron, and therefore no significant residual doping or other effect of the ions 18 on the epitaxial layer 10 takes place after the oxidation step of FIG. 1E.

Figure 1F:
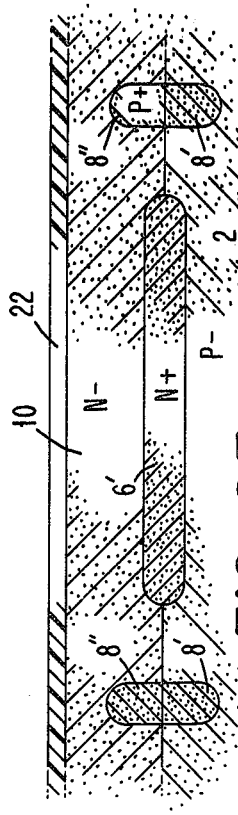
Figure 2F:
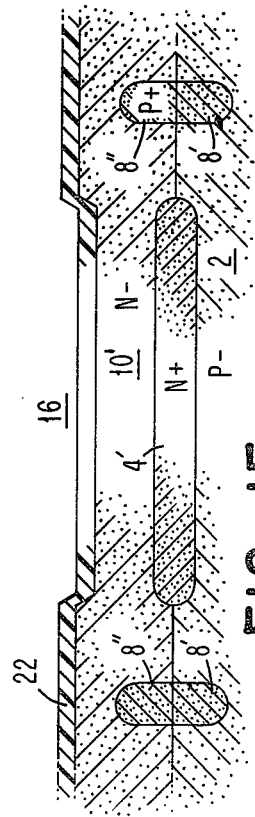

FIGS. 1f and 2f show the formation of the reoxidized layer 22 of silicon dioxides for the upward injecting and downward injecting transistors, respectively, after removing the existing oxide layer 12 and oxide layer 20 in an oxide stripping step. The oxide layer 12 and layer 20 are removed by chemical etch techniques using HF. The new oxide layer 22 is formed in a dry oxygen and steam ambient at 970° C. with a cycle time to achieve 300 nm thickness.

It is to be noted at this point that the thickness of the epitaxial layer 10' in the upward injecting transistor above the subemitter 4' where the oxide layer 20 had been formed, is thinner than the corresponding epitaxial region 10 over the subcollector 6' in the downward injecting transistor. For example, the epitaxial layer 10' will have a thickness of about 2.8 um corresponding to a thickness of 200 nm for the thermally grown oxide layer 20, while the epitaxial layer 10 has a thickness of 2.89 um. As another example, the epitaxial layer 10' will have a thickness of about 2.65 um corresponding to a thickness of 500 nm for the thermally grown oxide layer 20, while the epitaxial layer 10 has a thickness of 2.85 um. The relative thickness of the epitaxial layer 10 over the second buried region 6' is from 1.01 to 1.50 times the relative thickness of the epitaxial layer 10' over the first buried region 4'.

Figure 1G:
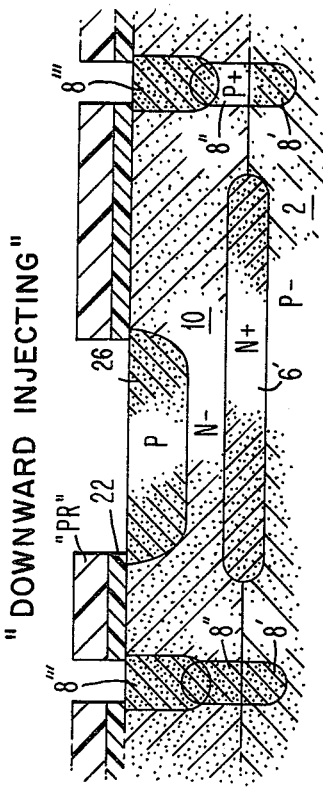
Figure 2G:
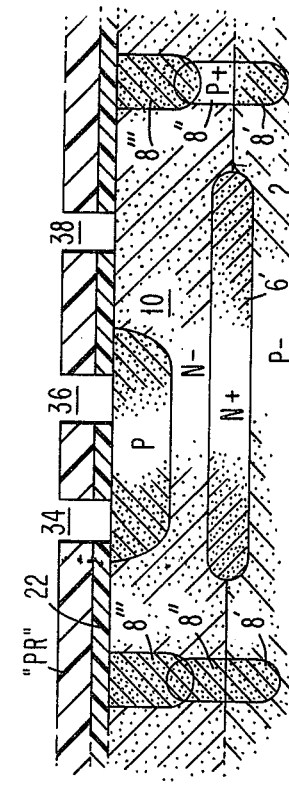

FIGS. 1g and 2g show the formation of the P-type base region 24 and 26 in the upward injecting and downward injecting transistors, respectively. This step also provides for the formation of P-type downward portion 8'''. The P-type regions 24, 26, and 8''' are formed by conventional photolithography and diffusion steps. The P-regions 24, 26, and 8''' have a surface concentration of about $5 \times 10^{18}$ atoms/cm$^3$ and a junction depth of about 1.2 um. The P-regions 24, 26, and 8''' are then oxidized in O$_2$ at about 1000° C. to grow a 110 nm layer of oxide.

Figure 1H:
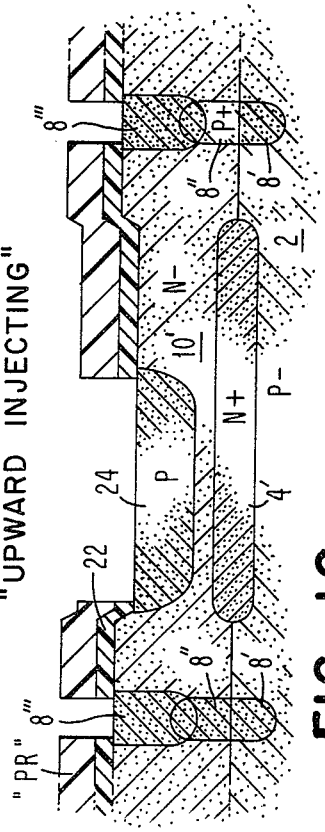
Figure 2H:
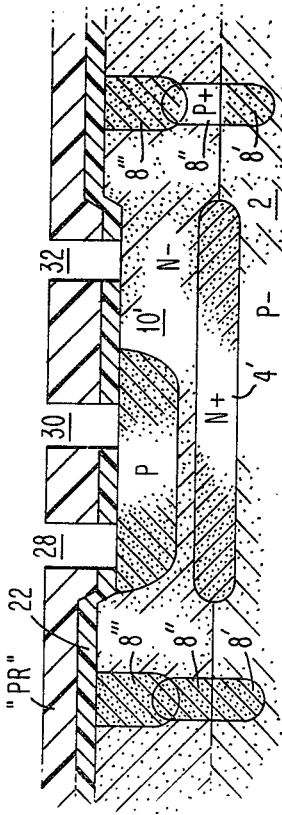

FIGS. 1h and 2h show the formation of contact holes 34 and 28 through the oxide layer 22 for the purpose of forming the emitter and collector diffusions 42 and 40, respectively, in the downward injecting and upward injecting transistors, respectively. Simultaneously, the windows 28, 30, 32, 36, and 38 are formed in passivating oxide layer 22 by conventional photolithographic and oxide etching techniques.

Figure 1I:
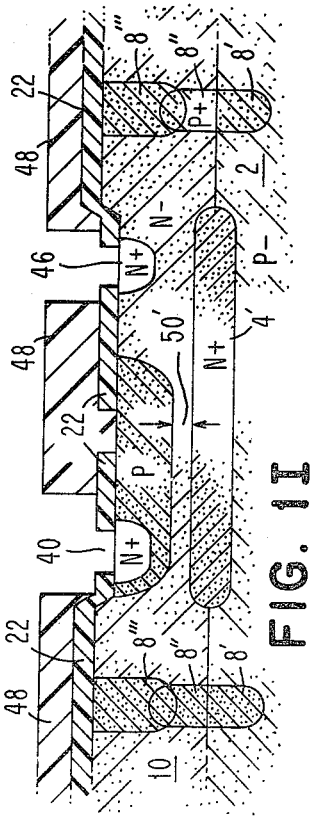
Figure 2I:
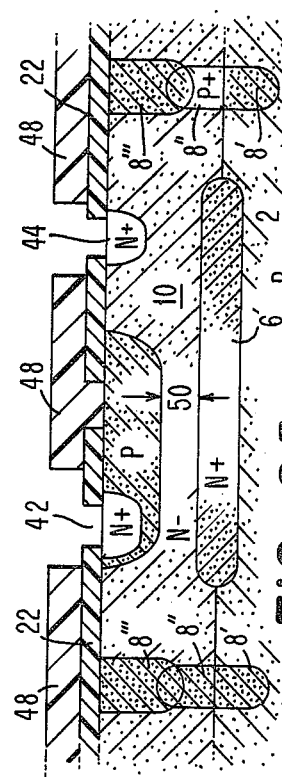

FIGS. 1i and 2i show the completed upward injecting and downward injecting transistors, respectively. The N+ collector 40 is formed in the upward injecting transistor in FIG. 1i and the N+ emitter 42 is formed in the downward injecting transistor of FIG. 2i. The N+ regions 40, 42, 44, and 46 are formed by first defining a photoresist blocking layer 48 whose windows overlap the previously defined oxide windows 28, 32, 34, and 38 while blocking windows 30 and 36. N+ regions 40, 42, 44, and 46 are formed by ion implanting arsenic through the oxide windows 28, 32, 34, and 38 at an energy of 50 Kev and dose $8 \times 10^{15}$cm$^{-2}$. Photolayer 48 is then stripped and subsequent anneal of 50 minutes at 1050° C. is used to activate the arsenic and diffuse to final junction depth to 0.6 um.

The sequence of steps shown in FIGS. 1a–i through 2a–i are for the process as performed on a single semiconductor chip, I$^2$L circuits operating in a low signal voltage and off-chip driver devices operating at a relatively high signal voltage. The vertical NPN transistor operated in an upward injection mode shown in FIG. 1i as is conventionally employed in I$^2$L circuitry, is formed with a thinner epitaxial layer 50' between the buried subemitter 4' and base region 24, than is the thicker epitaxial layer 50 separating the buried subcollector 6' from the base region 26 in the downward injecting NPN vertical transistor shown in FIG. 2i. By reducing the epitaxial thickness for the upward injecting vertical transistor in the I$^2$L circuit, the charge storage characteristic of the device is reduced and the injection efficiency of the device is increased. It can be shown that the charge stored in the epitaxial regions 50', 50 is proportional to the square of the thickness of these regions. Hence, for a thermally grown oxide layer 20 of thickness 500 nm, and with an upward diffusion of subemitter 4' of 1.4 um, the stored charge in region 50' of first separation distance 50 nm is 25 times smaller than the stored charge in region 50 of second separation distance 250 nm. It can be shown that the upward injecting device has an injection efficiency which is proportional to the average doping concentration in the subemitter region 4' and 50'. Since the epitaxial layer region 50' is a lowly doped region, the average doping concentration in the subemitter region 4' and 50' is increased by minimizing the thickness of the lowly doped region 50'. The first separation distance in region 50' can be less than 300 nm and the second separation distance in region 50 can be between 100 nm and 1000 nm.

By increasing the epitaxial thickness in the downward injecting vertical transistors used for the off-chip drivers and receivers, a larger signal voltage can be employed. It can be shown that the collector-base and collect-emitter breakdown voltages are directly proportional to the thickness of the lightly doped epitaxial region 50.

While the invention has been particularly shown and described with reference to the preferred embodiments thereof, it will be understood by those skilled in the art that the foregoing and other changes in form and details may be made therein without departing from the spirit and scope of the invention.

We claim:

1. A process for forming an integrated circuit bipolar transistor logic structure capable of performing logical functions with lower voltage signals and capable of outputting from the integrated circuit higher voltage signals, comprising the steps of:

forming a first buried region and a second buried region of a second conductivity type in a semiconductor substrate of a first conductivity type;

depositing an epitaxial layer of said second conductivity type over said first and second buried regions and said substrate;

implanting ions in the surface of said epitaxial layer over said first buried region to induce crystalline damage sufficient to enhance the reactivity of the implanted region in an oxidation reaction;

oxidizing the surface of said epitaxial layer forming a relatively thick oxide in said implanted region thereby forming a locally thinner region in the epitaxial layer over said first buried region, and a thicker epitaxial region over said second buried region;

forming a first and a second base regions of said first conductivity type in said epitaxial layer at first and second respective separation distances over said first and second buried regions, respectively; and forming a collector region in said first base region and an emitter in said second base region, of said second conductivity types;

whereby said thinner epitaxial layer over said first buried region imparts a lower charge storage characteristic and a higher injection efficiency for an upward injecting transistor and said thicker epitaxial layer over said second buried region imparts a higher voltage breakdown characteristic for a downward injecting transistor.

2. The process of claim 1, wherein said first conductivity type is P-type and said second conductivity type is N-type.

3. The process of claim 1, wherein said first conductivity type is N-type and said second conductivity type is P-type.

4. The process of claim 1, wherein said epitaxial layer has a thickness over said second buried region which is between 1.01 times and 1.50 times the thickness of said epitaxial layer over said first buried region.

5. The process of claim 1, wherein said first separation distance over said first buried region is less than 300 nm and said second separation distance over said second buried region is between 100 nm and 1000 nm.

6. The process of claim 1, wherein said implanted ions are selected from the group consisting of H, He, Ne, Kr, Ar, O, Si, C, B and Al.

7. The process of claim 1, wherein said ions are selected from the group consisting of H, He, Ne, Kr, Ar, O, Si, C, B and Al ions implanted at an acceleration voltage of between 10 and 500 kilo-electron volts, at a dose of $10^{12}$–$10^{16}$ ions per square centimeter.

8. The process of claim 7, wherein said step of oxidizing is by means of thermal oxidation in a mixture of dry $O_2$ and steam carried out at a temperature of between 800° C. and 1200° C. for a period of between 0.5 min and 10 hours.

9. The process of claim 1, wherein said step of oxidizing is by means of a mixture of dry $O_2$ and steam.

* * * * *